(12) United States Patent
Chiu et al.

(10) Patent No.: US 10,002,825 B2
(45) Date of Patent: Jun. 19, 2018

(54) METHOD OF FABRICATING PACKAGE STRUCTURE WITH AN EMBEDDED ELECTRONIC COMPONENT

(71) Applicant: Siliconware Precision Industries Co., Ltd., Taichung (TW)

(72) Inventors: Shih-Chao Chiu, Taichung (TW); Chun-Hsien Lin, Taichung (TW); Yu-Cheng Pai, Taichung (TW); Wei-Chung Hsiao, Taichung (TW); Ming-Chen Sun, Taichung (TW); Tzu-Chieh Shen, Taichung (TW); Chia-Cheng Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days. days.

(21) Appl. No.: 15/625,083

(22) Filed: Jun. 16, 2017

(65) Prior Publication Data

US 2017/0352615 A1 Dec. 7, 2017

Related U.S. Application Data

(62) Division of application No. 14/692,769, filed on Apr. 22, 2015, now Pat. No. 9,716,060.

(30) Foreign Application Priority Data

Sep. 12, 2014 (TW) .............................. 103131508 A

(51) Int. Cl.
*H01L 23/498* (2006.01)
*H05K 1/18* (2006.01)
(Continued)

(52) U.S. Cl.
CPC .... *H01L 23/49838* (2013.01); *H01L 21/6835* (2013.01); *H01L 23/49822* (2013.01);
(Continued)

(58) Field of Classification Search
None
See application file for complete search history.

(56) References Cited

U.S. PATENT DOCUMENTS 5,776,662 A * 7/1998 Shirai ................. H01L 21/4857
257/E23.062
9,406,658 B2 * 8/2016 Lee ......................... H01L 25/16
(Continued)

OTHER PUBLICATIONS

Definition of 'on' downloaded from URL < http://www.merriam-webster.com/dictionary/on> on Feb. 27, 2016.

*Primary Examiner* — Joseph Schoenholtz
(74) *Attorney, Agent, or Firm* — Mintz Levin Cohn Ferris Glovsky and Popeo, P.C.; Peter F. Corless; Steven M. Jensen

(57) ABSTRACT

The present invention provides a package structure with an embedded electronic component and a method of fabricating the package structure. The method includes: forming a first wiring layer on a carrier; removing the carrier and forming the first wiring layer on a bonding carrier; disposing an electronic component on the first wiring layer; forming an encapsulating layer, a second wiring layer and an insulating layer on the first wiring layer; disposing a chip on the electronic component and the second wiring layer; and forming a covering layer that covers the chip. The present invention can effectively reduce the thickness of the package structure and the electronic component without using adhesives.

23 Claims, 4 Drawing Sheets

(51) Int. Cl.

| | | |
|---|---|---|
| *H01L 23/538* | (2006.01) | |
| *H05K 3/00* | (2006.01) | |
| *H01L 21/683* | (2006.01) | |
| *H05K 3/32* | (2006.01) | |
| *H05K 3/10* | (2006.01) | |
| *H01L 23/00* | (2006.01) | |
| *H05K 1/02* | (2006.01) | |
| *H05K 3/46* | (2006.01) | |
| *H01L 23/31* | (2006.01) | |

(52) U.S. Cl.
CPC .... *H01L 23/49827* (2013.01); *H01L 23/5389* (2013.01); *H05K 1/185* (2013.01); *H05K 1/186* (2013.01); *H05K 1/189* (2013.01); *H05K 3/007* (2013.01); *H05K 3/0026* (2013.01); *H05K 3/32* (2013.01); *H01L 23/3121* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2221/68318* (2013.01); *H01L 2221/68345* (2013.01); *H01L 2224/131* (2013.01); *H01L 2224/13147* (2013.01); *H01L 2224/16227* (2013.01); *H01L 2224/16237* (2013.01); *H01L 2224/26175* (2013.01); *H01L 2224/2919* (2013.01); *H01L 2224/32058* (2013.01); *H01L 2224/32105* (2013.01); *H01L 2224/32106* (2013.01); *H01L 2224/32237* (2013.01); *H01L 2224/73204* (2013.01); *H01L 2224/81801* (2013.01); *H01L 2224/83101* (2013.01); *H01L 2924/15313* (2013.01); *H01L 2924/18161* (2013.01); *H01L 2924/19041* (2013.01); *H01L 2924/19103* (2013.01); *H01L 2924/19104* (2013.01); *H05K 1/0231* (2013.01); *H05K 3/108* (2013.01); *H05K 3/4682* (2013.01); *H05K 2201/0376* (2013.01); *H05K 2201/1053* (2013.01); *H05K 2201/10515* (2013.01); *H05K 2201/10674* (2013.01); *H05K 2201/10977* (2013.01)

(56) References Cited

U.S. PATENT DOCUMENTS

| | | | |
|---|---|---|---|
| 9,716,060 B2* | 7/2017 | Chiu | H01L 23/49838 |
| 2006/0208356 A1* | 9/2006 | Yamano | H01L 21/6835 |
| | | | 257/734 |
| 2007/0044303 A1* | 3/2007 | Yamano | H01L 21/4857 |
| | | | 29/830 |
| 2010/0276800 A1 | 11/2010 | Yanase et al. | |
| 2011/0083891 A1* | 4/2011 | We | H01L 23/5389 |
| | | | 174/260 |
| 2011/0241193 A1 | 10/2011 | Ding et al. | |
| 2011/0304016 A1* | 12/2011 | Nakamura | H01L 21/4857 |
| | | | 257/532 |
| 2012/0153493 A1* | 6/2012 | Lee | H01L 25/16 |
| | | | 257/774 |
| 2012/0199972 A1 | 8/2012 | Pagaila et al. | |
| 2013/0075924 A1 | 3/2013 | Lin et al. | |
| 2014/0252647 A1 | 9/2014 | Huang et al. | |
| 2015/0270247 A1 | 9/2015 | Chen et al. | |
| 2016/0005628 A1 | 1/2016 | Yap et al. | |
| 2016/0056087 A1 | 2/2016 | Wu et al. | |
| 2016/0353581 A1* | 12/2016 | Nagaura | B32B 15/01 |

* cited by examiner

METHOD OF FABRICATING PACKAGE STRUCTURE WITH AN EMBEDDED ELECTRONIC COMPONENT

CROSS-REFERENCES TO RELATED APPLICATIONS

This application is a divisional of copending application U.S. Ser. No. 14/692,769, filed on Apr. 22, 2015, which claims under 35 U.S.C. § 119(a) the benefit of Taiwanese Application No. 103131508, filed Sep. 12, 2014, the entire contents of which are incorporated herein by reference.

BACKGROUND OF THE INVENTION

1. Field of the Invention

The present invention relates to package structures and methods of fabricating the same, and, more particularly, to a package structure with an embedded electronic component and a method of fabricating the package structure.

2. Description of Related Art

With the rapid growth in electronic industry, there is an increasing need in low-profile electronic products. Reducing substrate thickness, increasing production efficiency and lowering the cost are some of the major developmental areas.

FIG. 1 shows a conventional chip-size package structure. The chip-size package structure comprises a hard board 20, a first wiring layer 21a, a second wiring layer 21b, conductive components 22, an encapsulating layer 25, and electronic components 23. The hard board 20 has opposing first and second surfaces 20a and 20b. A first wiring layer 21a and a second wiring layer 21b are formed on the first surface 20a and second surface 20b of the hardboard 20, respectively. The first wiring layer 21a is electrically connected with the second wiring layer 21b. The first wiring layer 21a has a plurality of connection pads 211.

The conductive components 22 are formed on the connection pads 211. The electronic components 23 are embedded in the encapsulating layer 25. The electronic component 23 has an active surface 23a and a non-active surface 23b, and a plurality of electrode pads 231 are formed on the active surface 23a.

In fabricating process of disposing the electronic components 23 in the encapsulating layer 25, after the electronic components 23 are disposed on the encapsulating layer 25, the encapsulating layer 25 is heated, and pressed to couple with the electronic components 23 and the hardboard 20, such that the electronic components 23 are encapsulated by the encapsulating layer 25, allowing the non-active surface 23b of the electronic components 23 to be attached on the hardboard 20. Besides, the non-active surface 23b is adhered with a chip adhering film 24.

However, the conventional chip-size package structure requires the use of a hard board 20, which leads to an overall increase in package thickness and the size of the package and the electronic components 23 are attached to the hardboard 20 via the chip adhering film 24, thereby increasing the cost and reducing the production efficiency.

Accordingly, there is an urgent need to provide a package structure with an embedded component and manufacturing method thereof, wherein the foregoing drawbacks encountered in prior art can be solved, as well as reduced cost and increased production efficiency.

SUMMARY OF THE INVENTION

In view of the foregoing drawbacks of the prior art, the present invention provides a package structure with an embedded electronic component and a method of fabricating the package structure. The method comprises: forming on a bonding carrier a first wiring layer having opposing first and second surfaces, and disposing an electronic component on the bonding carrier, wherein the bonding carrier is coupled to the second surface of the first wiring layer; forming on the first wiring layer an encapsulating layer that encapsulates the electronic component and has at least a first hole for exposing a portion of the first surface of the first circuit therefrom; and forming a second wiring layer on the encapsulating layer, wherein the second wiring layer has a portion that fills into the at least a first hole and is electrically connected with the first wiring layer.

The present invention further provides a package structure with an embedded electronic component, the package structure comprising: an encapsulating layer having opposing first and second surfaces, and a plurality of first holes communicating the second surface; a first wiring layer embedded in the encapsulating layer and exposed from the first surface of the encapsulating layer; an electronic component embedded in the encapsulating layer and exposed from the first surface of the encapsulating layer; and a second wiring layer formed on the second surface of the encapsulating layer and having a portion filling the first hole and electrically connected with the first wiring layer.

Accordingly, in the package structure with an embedded electronic component and the method of fabricating the package structure according to the present invention after the carrier is removed, the first wiring layer and the electronic component are coupled to the bonding layer, for subsequent processing. The present invention does not require the use of a hard board as a carrier, such that the thickness of the package structure is reduced effectively, and the low-profile requirement is met. Besides, the present invention utilizes bonding layers to hold the electronic components in place, without the need of using an adhesive, thereby further lowering the manufacturing cost and increasing the production efficiency.

Therefore, there is an urgent need to solve the foregoing problems.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "first", "second", "top", "side", and bottom" etc., are merely for illustrative purpose and should not be construed to limit the scope of the present invention.

FIGS. 2A-2K are schematic view illustrating a method of fabricating a package structure with an embedded electronic component according to the present invention.

Figure 1:
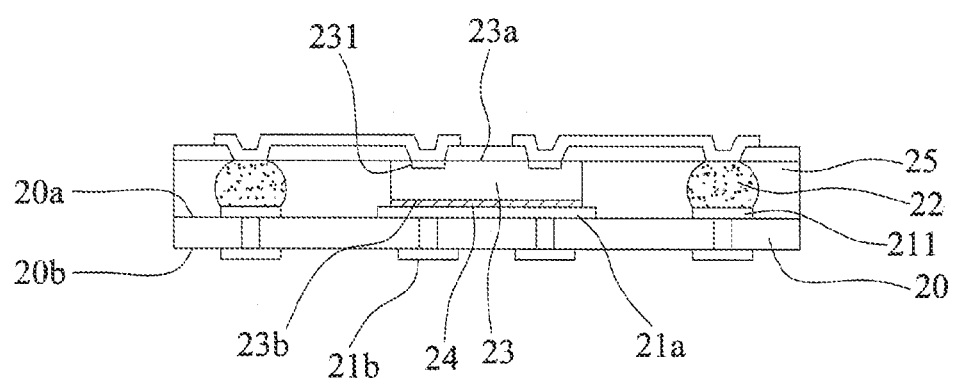
FIG. 1 is a schematic view of a conventional chip size package structure.
Figure 2A:
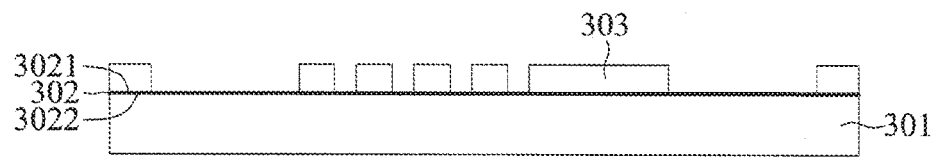
FIGS. 2A-2K are schematic view illustrating a method of fabricating a package structure with an embedded electronic component according to the present invention, wherein FIG. 2E' is another embodiment of FIG. 2E, and FIG. 2J' is another embodiment of FIG. 2J.

As shown in FIG. 2A, a carrier 301 is provided. A seed layer 302 is formed on the carrier 301. The seed layer 302 has opposing first and second surfaces 3021 and 3022. The seed layer 302 is formed by electro-less method or sputtering method. In an embodiment, the carrier 301 is a glass board or a metal board provided with an adhesive or a releasing agent.

A patterned resist layer 303 is formed on the first surface 3021 of the seed layer 302, with a portion of the first surface 3021 of the seed layer 302 being exposed therefrom.

Figure 2B:
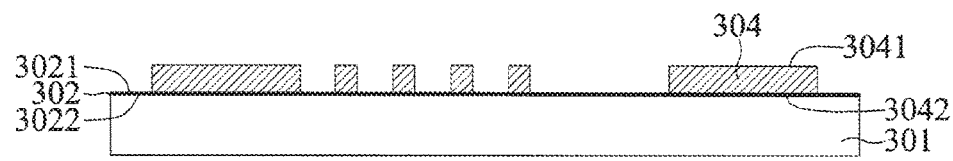

As shown in FIG. 2B, a first wiring layer 304 is formed on the exposed portion of the first surface 3021 of the seed layer 302 by an electroplating method. The first wiring layer 304 has opposing first and second surfaces 3041 and 3042. In embodiment, the first wiring layer 304 is made of copper. Then, the patterned resist layer 303 is removed.

Figure 2C:
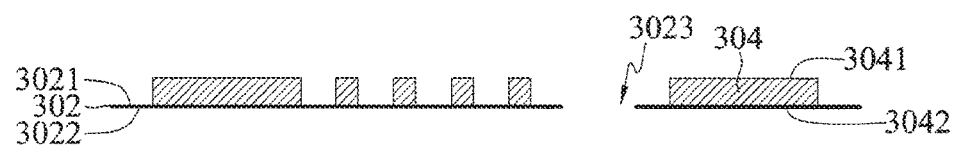

As shown in FIG. 2C, after the patterned resist layer 303 is formed, a second hole 3023 is formed to penetrate the seed layer 302, and then the carrier 301 is removed. In an embodiment, the carrier 301 can be removed before the second hole 3023 is formed. Alternatively, the second hole 3023 can be formed, and then the carrier 301 is removed.

In an embodiment, the second hole 3023 is formed by mechanical drilling or laser drilling, or formed by an etching method.

Figure 2D:
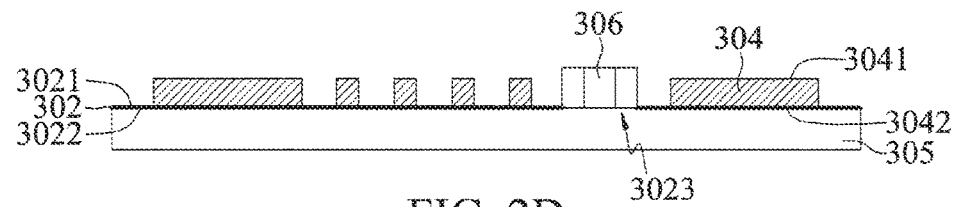

As shown in FIG. 2D, a bonding carrier 305 is coupled to the seed layer 302. In other words, the second surface 3022 of the seed layer 302 is coupled to the bonding carrier 305, to carry the first wiring layer 304 to be formed thereon, and a portion of the bonding carrier 305 is exposed from the second hole 3023, where the exposed portion of the bonding layer 305 in the second hole 3023 is coupled to the electronic component 306.

In an embodiment, the bonding carrier 305 is an adhesive, and the electronic component 306 is an active component or a passive component, such as a multi-layer ceramic capacitor (MLCC).

Figure 2E:
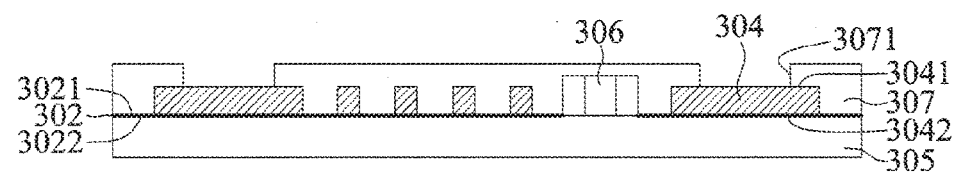
Figure 2E:
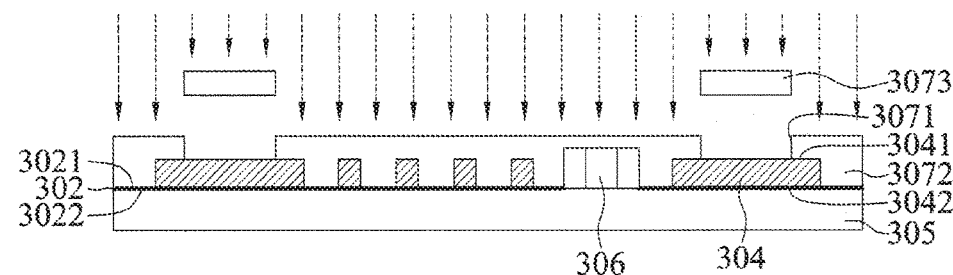

As shown in FIG. 2E, an encapsulating layer 307 is formed on the first wiring layer 304 and the seed layer 302, and completely encapsulates the electronic component 306, but partially encapsulates the first wiring layer 304. The encapsulating layer 307 is formed on the first wiring layer 304 by lamination or molding of epoxy resin. Subsequently, laser drilling is performed to form at least one first hole 3071. The first hole 3071 exposes a portion of the first surface 3041 of the first wiring layer 304.

In an embodiment, the encapsulating layer 307 is formed by an exposure and development method. As shown in FIG. 2E', a photosensitive material 3072 is applied to the first surface 3041 of the first wiring layer 304 and the seed layer 302, the exposure and development process is performed by using a mask 3073 to remove the unexposed photosensitive material 3072. The exposed photosensitive material 3072 forms the encapsulating layer 307 and the first hole 3071.

Figure 2F:
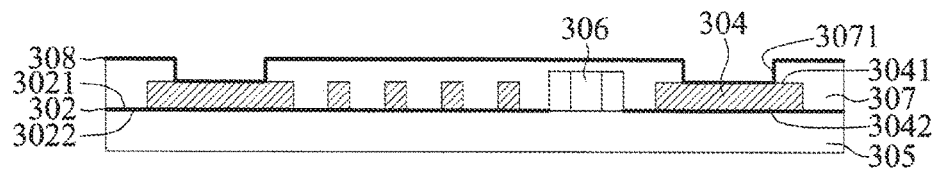

In the encapsulating layer 307 and the first hole 3071, a seed layer 308 is formed by an electro-less or sputtering method. As shown in FIG. 2F, the seed layer 308 is made of copper, and functions as a current pathway for a subsequent electroplating process.

Figure 2G:
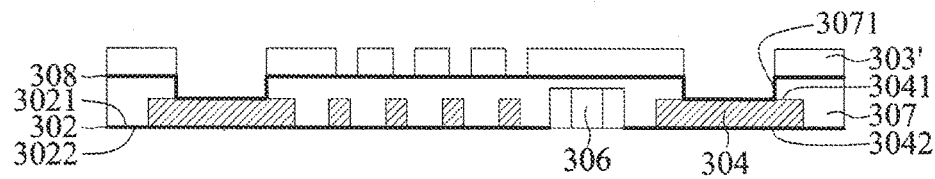

As shown in FIG. 2G, after the bonding layer 305 is removed, a patterned resist layer 303' is formed on the seed layer 308 to expose a portion of the seed layer 308. The patterned resist layer 303' does not cover the first hole 3071.

Figure 2H:
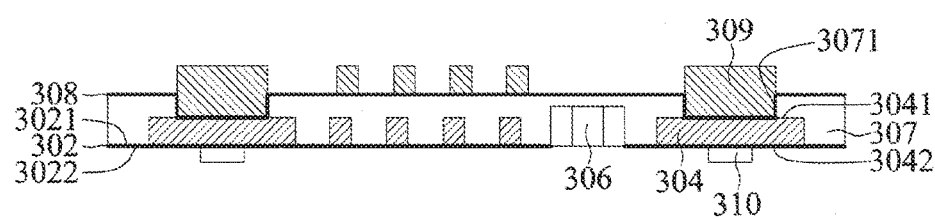

As shown in FIG. 2H, after the exposed portion of the seed layer 308 is electroplated to form the second wiring layer 309, the patterned resist layer 303' is removed. In an embodiment, the second wiring layer 309 is made of copper. A plurality of connection pads 310 are formed on the second surface 3022 of the seed layer 302 on the second surface 3042 of the first wiring layer 304. In an embodiment, the connection pads 310 are formed by electroplating method after the resist layer is patterned, for electrically connecting the seed layer 302 and the second surface 3042 of the first wiring layer 304. Alternatively, the connection pads 310 can be formed before, after or at the same time when the second wiring layer 309 is formed. In another embodiment, the second wiring layer 309 can be formed, and then the bonding layer 305 is removed.

In an embodiment, the second wiring layer 309 is formed on the encapsulating layer 307, and a portion of the second wiring layer 309 fills in the first hole 3071 of the encapsulating layer 307 and electrically connected to the seed layer 308 and the first surface 3041 of the first wiring layer 304.

Figure 2I:
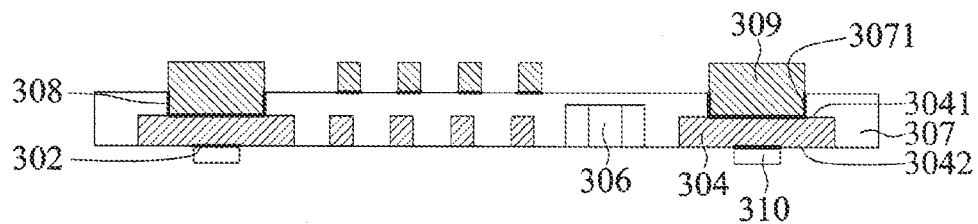

As shown in FIG. 2I, the seed layer 308 that is not covered by the second wiring layer 309 and the seed layer 302 that is not covered by the connection pads 310 are removed by etching.

Figure 2J:
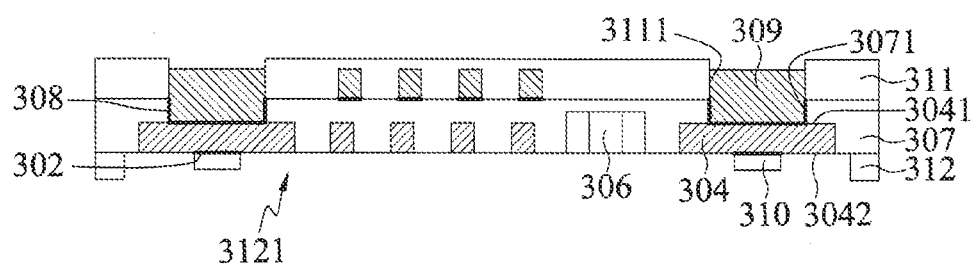
Figure 2J:
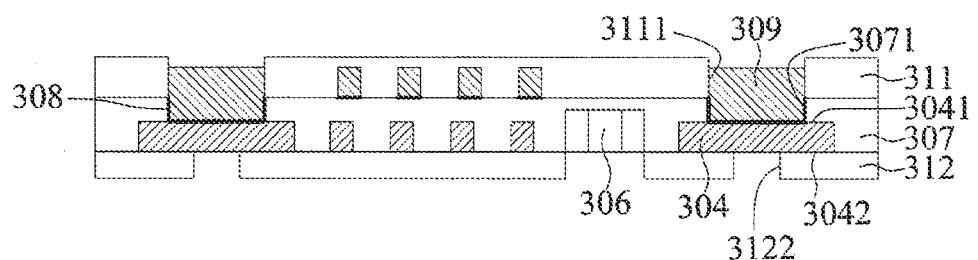

As shown in FIG. 2J, a first insulating layer 311 is formed on the encapsulating layer 307, and the encapsulating layer 307 is formed with at least a third hole 3111. The first insulating layer 311 covers a portion of the second wiring layer 309, and a third hole 3111 exposes the second wiring layer 309 in the first hole 3071. The third hole 3111 has the same size as that of the first hole 3071, that is, the side surface of the first hole 3071 is flush with the side surface of the third hole 3111. In another embodiment, the size of the third hole 3111 can be greater or less than the first hole 3071, and a portion of the encapsulating layer 307, or a portion of the second wiring layer 309 is exposed from the third hole 311.

On the other side of the encapsulating layer 307, that is, on the encapsulating layer 307 formed on the second surface 3042 of the first wiring layer 304 and on the first wiring layer 304, a second insulating layer 312 is formed. The second insulating layer 312 is defined with an accommodating space 3121, for exposing a portion of the first wiring layer 304, a portion of the encapsulating layer 307, the connection pads 310 and the electronic components 306.

In an embodiment, as shown in FIG. 2J', it is also applicable not to form the connection pads 310, but the contact area of the electronic components 306 is determined by the part of the exposed first wiring layer from the second insulating layer 312 and the size of the fourth holes 3122 of the electronic component 306.

In an embodiment, the first insulating layer 311 and the second insulating layer 312 are made of solder mask.

Figure 2K:
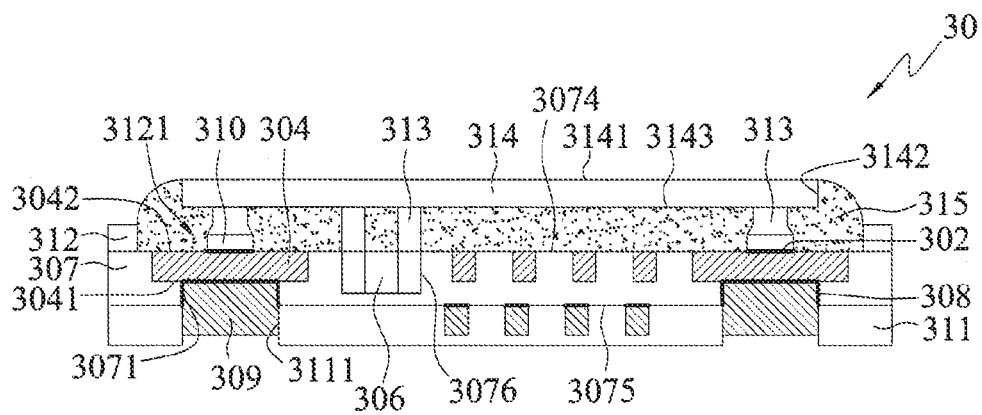

As shown in FIG. 2K, a chip 314 is provided. A plurality of conductors 313 are formed on the chip 314, and the chip 314 is coupled to the connection pads 310 and the electronic components 306 through the conductors 313, and electrically connected to the first wiring layer 304, the second wiring layer 309 or the electronic components 306 via the conductors 313. In an embodiment, the conductors 313 are solder bumps or copper pillar.

In another embodiment, following FIG. 2J', the chip 314 and the conductors 313 are mounted in the fourth holes 3122, and electrically connected with the first wiring layer 304.

A covering layer 315 is formed on the first surface 3074 of the encapsulating layer 307, or in the accommodating space 3121. In an embodiment, the covering layer 315 is made of a molding compound or an underfill. The covering layer 315 covers the first wiring layer 304, the electronic components 306, the conductors 313, the encapsulating layer 307, and the side surface 3142 and the bottom surface 3143 of the chip 314, with the top surface 3141 of the chip 314 be if exposed therefrom, Thus, the package structure with an embedded electronic component 30 according to the present invention is obtained.

The present invention further provides a package structure with an embedded electronic component 30. Referring to FIG. 2K, the package structure comprises a first insulating layer 311, an encapsulating layer 307, a second wiring layer 309, a first wiring layer 304, an electronic component 306, and a plurality of conductors 313.

The encapsulating layer 307 has opposing first and second surfaces 3074 and 3075, and a plurality of first holes 3071 communicating the second surface 3075. The first wiring layer 304 is embedded in the encapsulating layer 307 and exposed from the first surface 3074 of the encapsulating layer 307. The electronic component 306 is also embedded in the cavity 3076 of the encapsulating layer 307 and exposed from the first surface 3074 of the encapsulating layer 307.

In an embodiment, the encapsulating layer 307 is made of a photosensitive material or epoxy. The electronic component 306 can be an active component or a passive component such as a multi-layer ceramic capacitor (MLCC). The second surface 3042 of the first wiring layer 304 is flush with the first surface 3074 of the encapsulating layer 307.

The first insulating layer 311 is formed on the second surface 3075 of the encapsulating layer 307, and has a plurality of third holes 3111 corresponding in position to the first holes 3071. The second wiring layer 309 is also formed on the second surface 3075 of the encapsulating layer 307. In other words, the second wiring layer 309 is partially embedded in the first insulating layer 311, and coupled to the second surface 3075 of the encapsulating layer 307. A portion of the second wiring layer 309 fills the first hole 307, extends to the third hole 3111, and electrically connected with the first wiring layer 304. In an embodiment, the conductors 313 are formed in the first wiring layer 304 and the electronic components 306.

In an embodiment, the package structure further comprises a second insulating layer 312, a plurality of connection pads 310, a chip 314, and a covering layer 315.

The connection pads 310 are formed on the second surface 3042 of the first wiring layer 304 that is electrically connected with the second wiring layer 309.

A second insulating layer 312 is formed on the first surface 3074 of the encapsulating layer 307 and the first wiring layer 304, and an accommodating space 3121 is defined by the second insulating layer 312, the encapsulating layer 307 and the first wiring layer 304.

The chip 314 having a plurality of conductors 313 is formed on the connection pads 310 or on the first wiring layer 304, and is electrically connected to the first wiring layer 304, the second wiring layer 309 or the electronic components 306. The covering layer 315 fills the accommodating space 3121, and covers the conductors 313, the first wiring layer 304, the encapsulating layer 307, and the side surface 3142 and the bottom surface 3143 of the chip 314, with the top surface 3141 of the chip 314 being exposed therefrom.

In an embodiment, the first insulating layer 311 and the second insulating layer 312 are made of solder mask, and the conductors 313 are solder bumps or copper pillars.

With the package structure with an embedded electronic and the method of fabricating the package structure according to the present invention, in which the carrier is removed after the first wiring layer is formed on the carrier, and the first wiring layer and the electronic components are coupled to the bonding layers for subsequent processes, there is no need of using hardboard as a carrier. Hence, the package structure has a reduced thickness, so as to achieve the objective of low-profile packages. Moreover, the use of the combination of bonding layers and the encapsulating layer to secure the electronic components eliminate the use of an adhesive, and thereby reducing the cost and increasing production efficiency.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a package structure with an embedded component, comprising:
    forming on a bonding carrier, a first wiring layer having opposing first and second surfaces, and disposing an electronic component on the bonding carrier, wherein the second surface of the first wiring layer is coupled to the bonding carrier;
    forming on the first wiring layer an encapsulating layer that encapsulates the electronic component and is formed with at least a first hole for exposing a portion of the first surface of the first circuit therefrom;
    removing the bonding carrier, wherein the electronic component is exposed from the encapsulating layer; and
    forming a second wiring layer on the encapsulating layer, in a manner that a portion of the second wiring is filled into the at least a first hole, so as for the second wiring layer to be electrically connected with the first wiring layer.

2. The method of claim 1, further comprising forming on the encapsulating layer a first insulating layer formed with at least a third hole, for exposing the portion of the second wiring layer exposed from the at least a first hole.

3. The method of claim 2, wherein an end of the at least a first hole is flush with an end of the third hole.

4. The method of claim 1, further comprising, after the second wiring layer is formed, forming a second insulating layer on the encapsulating layer on the second surface of the first wiring layer and on the first wiring layer.

5. The method of claim 4, wherein the second insulating layer exposes a portion of the first wiring layer or the electronic component.

6. The method of claim 1, further comprising, after, before or at the time the second wiring layer is formed, forming a plurality of connection pads on the second surface of the first wiring layer.

7. The method of claim 6, further comprising forming a plurality of conductors on a chip, and then electrically connecting the chip to the connection pads and the electronic component through the conductors.

8. The method of claim 7, wherein the conductors are solder bumps or copper pillars.

9. The method of claim 7, further comprising forming a covering layer that covers the chip.

10. The method of claim 9, wherein the chip has a top surface exposed from the covering layer.

11. The method of claim 1, further comprising forming a plurality of conductors on a chip, and then coupling the chip to the first wiring layer and the electronic component through the conductors.

12. The method of claim 11, wherein the conductors are solder bumps or copper pillars.

13. The method of claim 11, further comprising forming a covering layer that covers the chip.

14. The method of claim 13, wherein the chip has a top surface exposed from the covering layer.

15. The method of claim 1, wherein forming the first wiring layer on the bonding carrier by comprises the steps of:
    forming a seed layer on a carrier;
    forming on the seed layer a patterned resist layer, from which a portion of the seed layer is exposed, such that the first wiring layer is formed on the exposed portion of the seed layer;
    removing the patterned resist layer;
    removing the carrier, and forming a second hole penetrating the seed layer;
    coupling the bonding carrier to the seed layer, to carry the first wiring layer; and
    coupling the electronic component to the bonding layer in the second hole.

16. The method of claim 15, wherein the second hole penetrating the seed layer is formed before the carrier is removed.

17. The method of claim 15, wherein the carrier is removed before the second hole penetrating the seed layer is formed.

18. The method of claim 15, wherein the second hole is formed by etching, laser drilling, or mechanical drilling.

19. The method of claim 15, wherein the carrier is a glass board or a metal board having an adhesive or a releasing agent on a surface thereof.

20. The method of claim 1, wherein the encapsulating layer and the first hole are formed by applying a photosensitive material on the first surface of the first wiring layer, and performing an exposure and development process using a mask.

21. The method of claim 1, wherein the encapsulating layer is formed by laminating or molding an epoxy resin on the first wiring layer, and using laser drilling method to form the first hole.

22. The method of claim 1, wherein the electronic component is an active component or a passive component.

23. The method of claim 1, wherein the bonding carrier is a tape.

* * * * *